United States Patent
Pickett et al.

(10) Patent No.: US 8,809,158 B2
(45) Date of Patent: Aug. 19, 2014

(54) DEVICE HAVING MEMRISTIVE MEMORY

(75) Inventors: Matthew D. Pickett, Palo Alto, CA (US); Jianhua Yang, Palo Alto, CA (US); Gilberto Medeiros Ribeiro, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 28 days.

(21) Appl. No.: 13/384,000

(22) PCT Filed: Mar. 12, 2010

(86) PCT No.: PCT/US2010/027129
§ 371 (c)(1),
(2), (4) Date: Jan. 13, 2012

(87) PCT Pub. No.: WO2011/112197
PCT Pub. Date: Sep. 15, 2011

(65) Prior Publication Data
US 2013/0023106 A1    Jan. 24, 2013

(51) Int. Cl.
*H01L 21/02* (2006.01)

(52) U.S. Cl.
USPC .................................. 438/382; 257/E21.004

(58) Field of Classification Search
None
See application file for complete search history.

(56) References Cited

U.S. PATENT DOCUMENTS

| | | | |
|---|---|---|---|
| 8,193,606 B2 * | 6/2012 | Kato et al. | 257/536 |
| 2004/0246780 A1 | 12/2004 | Kawahara | |
| 2009/0086524 A1 | 4/2009 | Alam | |
| 2011/0188294 A1 * | 8/2011 | Strachan et al. | 365/148 |
| 2011/0267870 A1 * | 11/2011 | Fiorentino et al. | 365/148 |
| 2012/0005418 A1 * | 1/2012 | Ribeiro et al. | 711/103 |
| 2012/0324140 A1 * | 12/2012 | Ordentlich et al. | 710/317 |

FOREIGN PATENT DOCUMENTS

| | | |
|---|---|---|
| JP | 2007-053126 | 3/2007 |
| WO | WO-2005-122706 | 12/2005 |

* cited by examiner

*Primary Examiner* — Zandra Smith
*Assistant Examiner* — Damian A Hillman

(57) ABSTRACT

A device (10) may include a semiconductor layer section (25) and a memory layer section (45) disposed above the semiconductor layer section (25). The semiconductor layer section (25) may include a processor (12; 412) and input/output block (16; 416), and the memory layer section (45) may include memristive memory (14; 300). A method of forming such device (10), and an apparatus (600) including such device (10) are also disclosed. Other embodiments are described and claimed.

20 Claims, 3 Drawing Sheets

DEVICE HAVING MEMRISTIVE MEMORY

STATEMENT OF GOVERNMENT INTEREST

This invention has been made with government support. The government has certain rights in the invention.

BACKGROUND

A memristor is a fundamental, two-terminal, circuit element that exhibits variable resistance. Its resistance is a function of the quantity and direction of charge flowing through the device. The memristor remembers the last resistance that it had when the flow of charge stopped, such that when charge begins flowing again, the resistance of the circuit is what it was when it was last active. Among other uses, memristors can be used in non-volatile random access memory (NVRAM) arrays.

Figure 1:
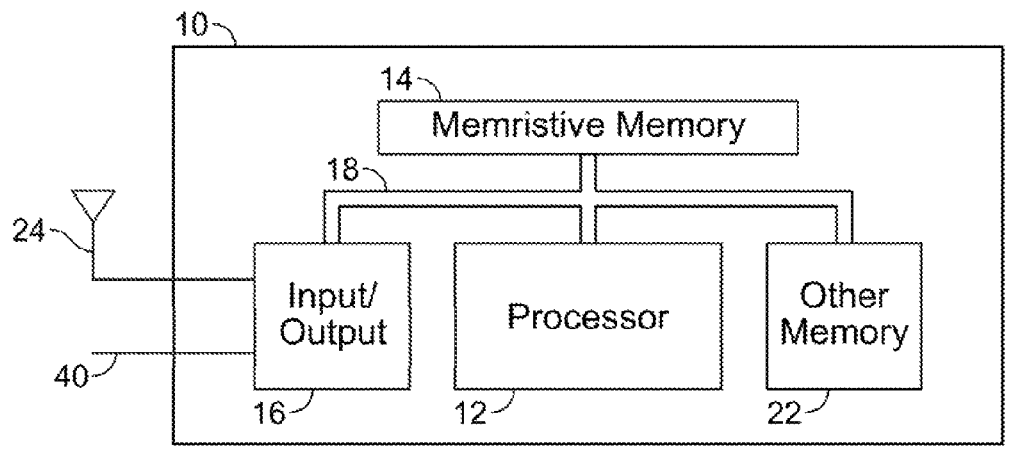
FIG. 1 is a conceptual illustration of an integrated circuit device according to embodiments of the invention.

Where considered appropriate, reference numerals may be repeated among the drawings to indicate corresponding or analogous elements. Moreover, some of the blocks depicted in the drawings may be combined into a single function.

DETAILED DESCRIPTION

In the following detailed description, numerous specific details are set forth in order to provide a thorough understanding of embodiments of the invention. However, it will be understood by those of ordinary skill in the art that the embodiments of the present invention may be practiced without these specific details. In other instances, well-known methods, procedures, components, and circuits have not been described in detail so as not to obscure the present invention.

A system on a chip (or SoC) integrates components of an electronic system onto a single integrated circuit. Systems on chips may include one or more processors, as well as input/output blocks and memory.

Reference is now made to FIG. 1, which is a conceptual illustration of an integrated circuit device 10 according to embodiments of the invention. Such device may include a SoC and be made as a single die that includes processor 12, memristive memory 14, communications input/output (I/O) 16, bus 18, and memory 22. The blocks included in integrated circuit device 10 are used as examples of blocks that could be used in an integrated circuit device as an embodiment of the invention; not every integrated circuit device 10 need include all of the above blocks and, alternatively, may have more blocks. With such blocks, integrated circuit device 10 can be used in many apparatuses, including cellular and mobile telephones, portable digital assistants (PDAs), sensing devices and systems, small computers (e.g., netbooks), and other devices where smaller size and lower power consumption may be desired. When housed within such an apparatus, integrated circuit device 10 may communicate with other apparatuses and other wired and wireless devices according to embodiments of the invention, such as by using processor 12 and communications I/O 16 via connection 40 and/or antenna 24 to transmit and/or receive signals (including data). Memristive memory 14 may be non-volatile memory made from memristors. Memory 22 may be a computer or processor readable medium or a computer or processor storage medium, such as, for example, a RAM (e.g., DRAM or SRAM), ROM, or a flash memory. Memory 22 may be volatile or non-volatile or a combination of the two, and although it is shown as a single block in FIG. 1, may be realized as multiple blocks. Memory 22 may also be used to store software instructions. Bus 18 may be used to transmit data between and among processor 12, memristive memory 14, communications I/O 16, and memory 22. Communications I/O 16 may be used to communicate with external apparatuses not on integrated device 10, such as mobile devices, PDAs, computers, telephones, storage devices, or displays or monitors, etc., and may comprise a USB, Ethernet, Wi-Fi, or other communications protocol connection.

Figure 2:
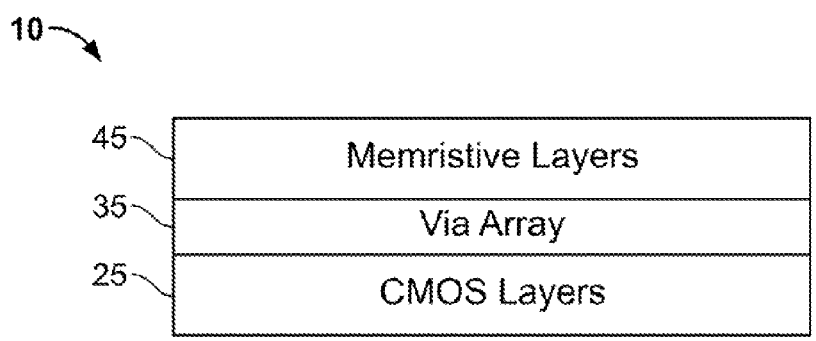
FIG. 2 is a conceptual illustration of a cross-section of the integrated circuit device according to embodiments of the invention.

Reference is now made to FIG. 2, which is a conceptual illustration of a schematic cross-section of integrated circuit device 10. Integrated circuit device 10 may include several sections, including CMOS layers section 25 and memristive memory layers section 45. Between these sections may be a via array section 35. Sections 25, 35, and 45 may each comprise one or more layers or arrays. Via array section 35 may be used to interconnect CMOS layers section 25 and memristive memory layers section 45. Via array section 35 may include metallization in addition to vias. CMOS layers section 25 may include transistors and other CMOS semiconductor devices that make up blocks of the SoC. As described with respect to FIG. 1, such SoC blocks may include processor 12, communications input/output (I/O) 16, and memory 22. Bus 18 may be realized through all three sections 25, 35, 45, since bus 18 allows the different blocks to communicate with each other.

Figure 3:
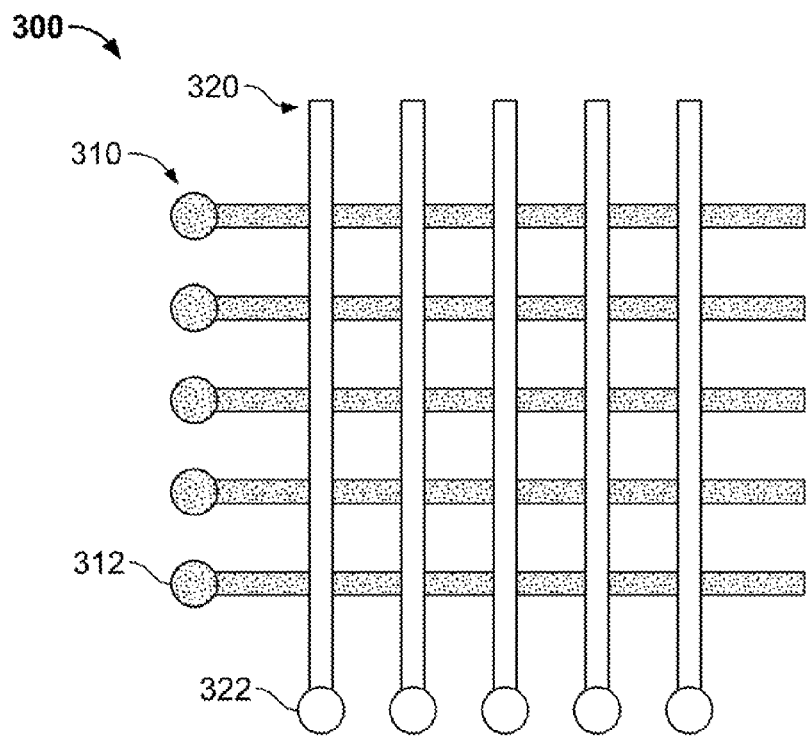
FIG. 3 is a conceptual illustration of a crossbar memory array according to embodiments of the invention.

Memristive memory layers section 45 can include one or more layers of memristive memory, connected to CMOS layers section 25 through via array section 35. Each memristive memory layer may be arranged as a crossbar array 300, shown in FIG. 3, which may include parallel strips or lines 310 oriented in one direction and parallel strips or lines 320 oriented in a second direction (which directions need not be perpendicular). At the ends of the lines 310 and 320 may be vias 312 and 322, used to connect crossbar array 300 to via array section 35 and CMOS layers section 25. Other examples of crossbar arrays are shown and described in commonly-owned patent application Ser. No. PCT/US09/47253, entitled, "Hierarchical On-Chip Memory," filed Jun. 12, 2009, the disclosure of which is hereby incorporated by reference. When comprising more than one layer, vias and interconnections may appear in and between each layer. Other arrangements of memristive memory layers section 45 are possible, as disclosed, for example, in commonly-owned U.S. patent application Ser. No. 12/696,361, entitled, "Interconnection Architecture for Multilayer Circuits," filed Jan. 29, 2010, the disclosure of which is hereby incorporated by reference. The arrangements disclosed therein also include crossbar arrays, as well as the Grove Architecture and the Thicket Architecture. The memristive memory layers may be interconnected using the Big Bend, Fully-squashed Big Bend, and Partially-squashed Big Bend wiring schemes, as well as staggered, circular shift, wrap-around, duplicated or replicated via arrays, as disclosed in that application. Although named in this embodiment "memristive memory layers section 45," this section 45 may also include memristive devices that do not act as memory, and may include other devices that are not memristive.

Thus, FIG. 2's depiction of integrated circuit device 10 is meant to be conceptual in that CMOS layers section 25 comprising SoC blocks may generally appear on the bottom of a stacked architecture, and memristive memory layers section 45 may generally appear over CMOS layers section 25. Between memory layers section 45 and CMOS layers section 25 may be a via array section 35, although in some embodiments each memristive layer may have associated with it a via array or wiring layer, as disclosed in previously-cited patent application Ser. No. PCT/US09/47253, and thus a separate via array section may not be realized.

Placing memristive memory above the CMOS layers (rather than within the same plane) allows the memory to be distributed across the die, which may result in certain memory cells being located near to their associated SoC blocks situated within the CMOS layers, and closer than in a 2D architecture. For example, memristive memory that is often accessed by processor 12 could be placed directly over the processor, and memristive memory that is often accessed by the I/O 16 could be placed directly over the I/O block. Locating memory in this manner can save precious memory access time. Distances between blocks and memory in a 2D architecture of tens of microns may be replaced by distances in a 3D architecture of tens of nanometers, potentially speeding up access times by two to three orders of magnitude.

Moreover, using memristive memory may result in power savings for a number of reasons. Because point A to point B data transfer is responsible for much of the energy consumption in processors and SoCs, locating the non-volatile memory nearby greatly reduces this consumption. Also, memristive memory consumes less energy per bit than other types of memory.

Placing memristive memory above the CMOS layers also avoids the use of wafer bonding used in prior architectures, which can be expensive and results in lowered yield. Moreover, placing memristive memory above the CMOS layers (rather than within the same plane) may improve thermal management. In a 2D architecture, memory may be placed closely together to save die space. In a 3D architecture, if the size of the SoC blocks on the CMOS layers (processor, I/O, other memory) dictates the size of the die, then the memory on the memristive memory layers may not have to be as closely spaced, allowing for better heat dissipation. Alternatively, if the size of the SoC blocks on the CMOS layers dictates the size of the die, more memristive memory may be fabricated than otherwise might be available in a 2D architecture, and memory density can be increased.

In addition, even some of the wrap-around wiring schemes described in previously-cited U.S. patent application Ser. No. 12/696,361 as increasing the planar footprint of the device may still have space, speed, and power advantages over the 2D architecture. Other or different benefits may also be achieved.

Figure 4:
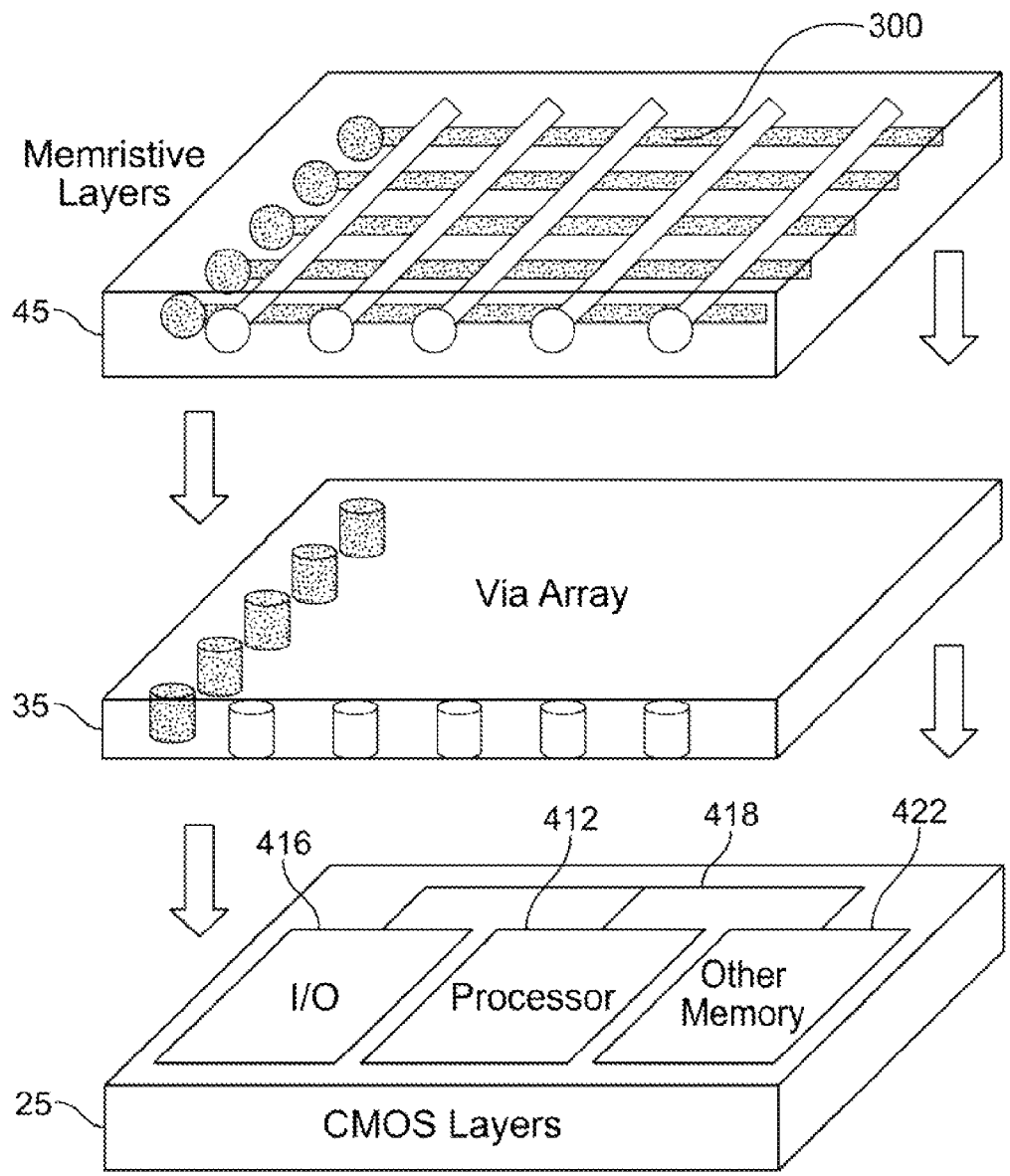
FIG. 4 is a conceptual illustration of a method of fabricating an integrated circuit device according to embodiments of the invention.
Figure 5:
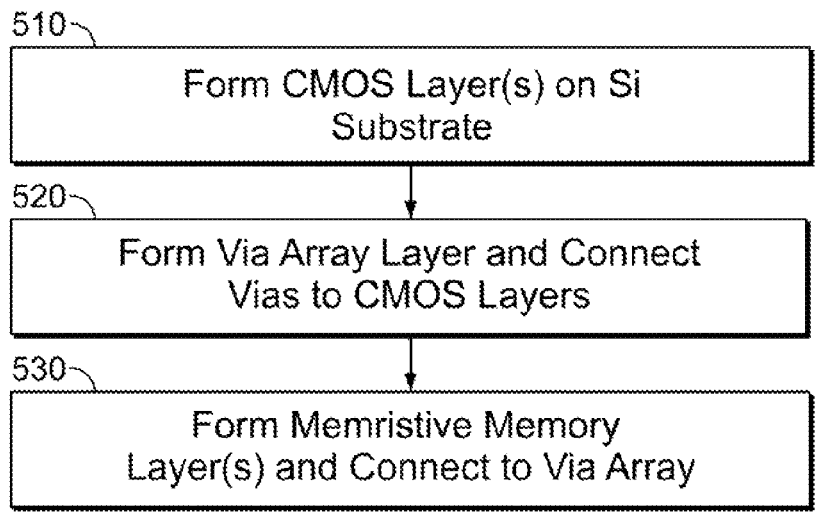
FIG. 5 is a flowchart of a method of fabricating an integrated circuit device according to embodiments of the invention.

Reference is now made to FIGS. 4 and 5, which are a conceptual illustration and a flowchart of a method of fabricating integrated circuit device 10 according to embodiments of the invention. In general, in operation 510, CMOS layers section 25 may be formed first on a silicon substrate. This section may include the transistors that comprise processor 412, communications I/O 416, and other memory 422, as well as interconnections that form bus 418. In operation 520, via array section 35 may be formed above CMOS layers section 25. In operation 530, above via array section 35 may then be formed memristive memory layers section 45, which, as discussed above, may also include vias and other interconnections to connect to SoC blocks on CMOS layers section 25. The vias and interconnections may be designed such that the memristive memory is distributed across the entire surface of the chip and provides local non-volatile memory for each SoC block and/or sub-block. Memristive memory layers section 45 may be formed using one or more crossbar arrays 300 in each layer. Some methods of forming memristive memory layers section 45 using multi-layer crossbar arrays and the various wiring schemes discussed above are disclosed in previously-cited U.S. patent application Ser. No. 12/696,361.

Figure 6:
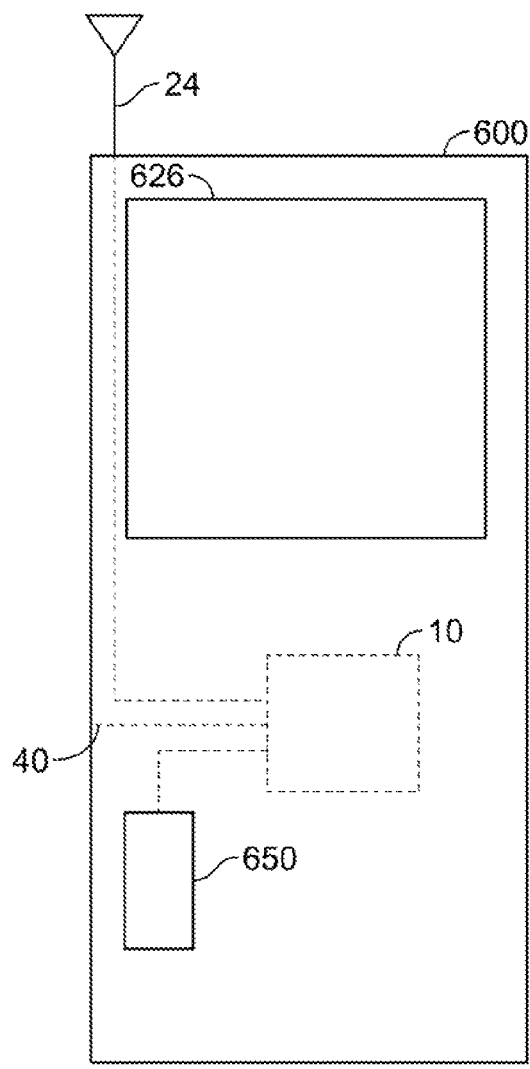
FIG. 6 is a conceptual illustration of an apparatus according to embodiments of the invention.

Reference is now made to FIG. 6, which is a conceptual illustration of an apparatus 600 according to embodiments of the invention. Apparatus 600 may be a wireless device, such as a cellular or mobile telephone, a portable digital assistant (PDA), or a small computer, for example, or a non-wireless device. Apparatus 600 (which may include display 626) may use integrated circuit device 10 to communicate (wirelessly or via wires) with external apparatuses such as mobile devices, PDAs, computers, telephones, storage devices, or displays or monitors, etc. Some of these communications may use antenna 24 and/or connection 40, which are connected to communications I/O 16 in integrated circuit device 10. Advantages of using integrated circuit device 10 in apparatus 600 are to increase the amount of memory and/or decrease power usage and heat dissipation. Other embodiments may include sensor 650 connected to communications I/O 16. In that scenario, sensor 650 may be used to sense phenomena in the atmosphere, and communicate the sensings to integrated circuit device 10, which can process the sensings and output them to other external apparatuses via communications I/O 16 and antenna 24 and/or connection 40. Although apparatus 600 is depicted in FIG. 6 as a wireless apparatus with a sensor, more generally apparatus 600 can be a wireless apparatus with or without a sensor or a non-wireless apparatus with or without a sensor.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The invention claimed is:

1. A device comprising:
    a semiconductor layer section including a processor and input/output block; and
    a memory layer section disposed above said semiconductor layer section and including memristive memory.

2. The device of claim 1, further comprising a bus for communicating among the processor, input/output block, and memory layer section.

3. The device of claim 2, wherein the semiconductor layer section further includes a volatile memory block in communication with the bus.

4. The device of claim 1, further comprising a via array section disposed between the semiconductor layer section and the memory layer section.

5. The device of claim 4, further comprising a bus for communicating among the processor, input/output block, and memory layer section, wherein the bus comprises at least part of said via array section.

6. The device of claim 1, wherein said input/output block communicates with external apparatuses.

7. A method comprising:
forming a semiconductor layer section to include a processor and input/output block; and
forming a memory layer section above said semiconductor layer section, said memory layer section including memristive memory.

8. The method of claim 7, further comprising forming a via array section between the semiconductor layer section and the memory layer section.

9. The method of claim 7, wherein the memory layer section comprises at least two memory layers.

10. The method of claim 9, further comprising forming vias and interconnections within the memory layer section.

11. An apparatus comprising:
an integrated circuit; and
a connection,
wherein said integrated circuit comprises
a processor and input/output block disposed within a semiconductor layer section, said input/output block in communication with said connection; and
a memristive memory array disposed within a second layer section above said semiconductor layer section.

12. The apparatus of claim 11, further comprising a bus for communicating among the processor, input/output block, and memristive memory array.

13. The apparatus of claim 11, further comprising a via array disposed within a third layer section between the semiconductor layer section and the second layer section.

14. The apparatus of claim 11, wherein said connection can be wired or an antenna.

15. The apparatus of claim 11, wherein said input/output block communicates with a sensor via said connection.

16. The device of claim 1, wherein the memory layer section comprises at least one memory layer arranged as a crossbar array.

17. The device of claim 1, wherein the memory layer section comprises more than one layer of memory.

18. The device of claim 1, wherein a portion of said memory layer section comprising memory most frequently accessed by said processor is disposed directly above said processor and is in communication with said processor through a via layer disposed between said memory layer section and said semiconductor layer section.

19. The device of claim 1, wherein a portion of said memory layer section comprising memory most frequently accessed by said input/output block is disposed directly above said input/output block and is in communication with said input/output block through a via layer disposed between said memory layer section and said semiconductor layer section.

20. The apparatus of claim 11, wherein:
said memristive memory array extends across said semiconductor layer section such that a portion of said memory array is directly above both said processor and said input/output block;
a portion of said memory array comprising memory most frequently accessed by said processor is disposed directly above said processor and is in communication with said input/output block through a via layer disposed between said second layer section and said semiconductor layer section; and
a portion of said memory array comprising memory most frequently accessed by said input/output block is disposed directly above said input/output block and is in communication with said input/output block through a via layer disposed between said second layer section and said semiconductor layer section.

* * * * *